US 9,055,699 B2

(12) United States Patent
Osato et al.

(10) Patent No.: US 9,055,699 B2
(45) Date of Patent: Jun. 9, 2015

(54) SWITCHING POWER SUPPLY DEVICE (75) Inventors: Tomokazu Osato, Konosu (JP);
Kazutoshi Fujii, Konosu (JP)

(73) Assignee: EYE LIGHTING SYSTEMS CORPORATION, Tokyo (JP)

( * ) Notice: Subject to any disclaimer, the term of this patent is extended or adjusted under 35 U.S.C. 154(b) by 404 days.

(21) Appl. No.: 13/552,911

(22) Filed: Jul. 19, 2012

(65) Prior Publication Data
US 2013/0027887 A1 Jan. 31, 2013

(30) Foreign Application Priority Data

Jul. 25, 2011 (JP) ................................ 2011-162403

(51) Int. Cl.
*H05K 7/20* (2006.01)

(52) U.S. Cl.
CPC ................................ *H05K 7/20909* (2013.01)

(58) Field of Classification Search
USPC ........................ 361/676–678, 679.46–679.54, 361/688–722, 752, 831
See application file for complete search history.

(56) References Cited

U.S. PATENT DOCUMENTS

| | | | | |
|---|---|---|---|---|
| 5,424,915 A * | 6/1995 | Katooka et al. | ................ | 361/695 |
| 6,320,776 B1 * | 11/2001 | Kajiura et al. | ................ | 363/141 |
| 7,436,661 B2 * | 10/2008 | Fong et al. | ................... | 361/695 |
| 8,159,820 B2 * | 4/2012 | Ibori et al. | ..................... | 361/695 |
| 8,335,081 B2 * | 12/2012 | Weiss | .............................. | 361/694 |
| 8,724,337 B2 * | 5/2014 | Teng et al. | ..................... | 361/760 |
| 8,837,119 B2 * | 9/2014 | Kishimoto et al. | ........... | 361/678 |
| 2006/0198104 A1 * | 9/2006 | Chang et al. | ............... | 361/695 |
| 2007/0279863 A1 * | 12/2007 | Illerhaus | ....................... | 361/695 |
| 2009/0116188 A1 * | 5/2009 | Fong et al. | ..................... | 361/695 |
| 2011/0222243 A1 * | 9/2011 | Nagami et al. | ................ | 361/697 |

FOREIGN PATENT DOCUMENTS

| | | |
|---|---|---|
| JP | 62-87889 A | 4/1987 |
| JP | 1-95599 A | 4/1989 |
| JP | 2000-152655 A | 5/2000 |
| JP | 2005-124322 A | 5/2005 |

OTHER PUBLICATIONS

Japanese Office Action dated Feb. 24, 2015, issued in corresponding JP Patent Application No. 2011-162403 with English translation (5 pages).

* cited by examiner

*Primary Examiner* — Courtney Smith
(74) *Attorney, Agent, or Firm* — Westerman, Hattori, Daniels & Adrian, LLP (57) ABSTRACT

A switching power supply device includes a case, a board that has circuit parts containing a switching element mounted thereon and is accommodated in the case, and a heat sink that is provided in the case so as to partition the inside of the case into a part mount chamber having the board accommodated therein and an air flow path through which air flows. The switching element of the circuit parts is mounted on the board while brought into contact with a surface of the heat sink that faces the part mount chamber, and cooled through the heat sink by the air flowing in the air flow path.

12 Claims, 5 Drawing Sheets

SWITCHING POWER SUPPLY DEVICE

The present application claims priority under 35 U.S.C. §119 to Japanese Patent Application No. 2011-162403 filed on Jul. 25, 2012. The content of the application is incorporated herein by reference in its entirety.

BACKGROUND OF THE INVENTION

1. Field of the Invention

The present invention relates to a switching power supply device having a switching element, a coil or/and a transformer.

2. Description of the Related Art

A heat sink having plural heat radiation fins is provided to a switching power supply device in which circuit parts containing a switching element, a coil or/and a transformer are mounted on a board. Circuit parts having a large amount of heat generation such as the switching element, etc. are fixed to the heat sink. The heat sink radiates heat generated by the circuit parts through the heat radiation fins. In this type of switching power supply device, it is considered that the heat radiation fins are directly exposed to (barely arranged at) the outside of the switching power supply device to radiate the heat to the outside. However, this configuration makes it unavoidable to design a housing (case) in a large size in order to increase a radiation efficiency. Therefore, a technique of making air flow into a case by using an air suction fan or/and an air blow-out fan to cool circuit parts by a forced air-cooling system and blowing out high-temperature air in the case to the outside to radiate heat has been proposed to satisfy an requirement of miniaturization of the switching power supply device (see JP-A-2005-124322).

However, when the circuit parts are cooled by making air flow into the case with the air suction fan or/and the air blow-out fan according to the forced air-cooling system, dust such as minute metal pieces, dirt or the like is sucked from the surrounding into the switching power supply device together with air. Furthermore, the dust sucked into the switching power supply device is liable to be trapped in the switching power supply device. When the dust such as the minute metal pieces, dirt or the like is accumulated in the power supply, the probability of occurrence of a failure caused by external factor increases. Accordingly, there is a problem that the switching power supply device may have a short lifetime.

SUMMARY OF THE INVENTION

The present invention has been implemented in view of the problem of the foregoing technique, and has an object to provide a switching power supply device that reduce an effect of dust and can cool circuit parts efficiently.

In order to attain the above object, according to a first aspect of the present invention, a switching power supply device that has at least one switching element and performs power conversion on the basis of a switching operation of the switching element, comprises, a case, a board that has circuit parts containing at least one switching element mounted thereon and is accommodated in the case, and a heat sink that is provided in the case so as to partition the inside of the case into a part mount chamber having the board accommodated therein and an air flow path through which air flows, wherein the at least one switching element out of the circuit parts is mounted on the board while brought into contact with a surface of the heat sink that faces the part mount chamber, and cooled through the heat sink by the air flowing in the air flow path.

In the above switching power supply device, the air flow path has an air suction port through which air is introduced from the outside of the case and an air blow-out port through which air is blown out to the outside of the case, and the air introduced from the air suction port is made to flow through the air flow path along another surface of the heat sink that faces the air flow path.

In the above switching power supply device, the heat sink is provided with through-holes that penetrates through the heat sink so that the part mount chamber and the air flow path intercommunicate with each other through the through-holes, and a part of air flowing in the air flowing path is introduced from the air flow path through the through-holes to the part mount chamber to cool the circuit parts mounted on the board.

In the above switching power supply device, the part of the air flowing in the air flow path is introduced to the part mount chamber while an air flowing direction thereof is deflected by a substantially right angle.

In the above switching power supply device, the circuit parts contains a power conversion unit having an input side winding wire and an output side winding wire, and the input side winding wire is provided at an air suction side of the air flow path while the output side winding wire is provided at an air blow-out side of the air flow path.

In the above switching power supply device, the power conversion unit comprises at least one of a coil and a transformer.

The above switching power supply device further comprises an air blower for making air flow through the air flow path.

In the above switching power supply device, the air blower is disposed in the part mount chamber.

In the above switching power supply device, the air blower is disposed in the air flow path.

According to a second aspect of the present invention, in a switching power supply device having a case, a board that has circuit parts mounted thereon and is accommodated in the case, the circuit parts containing at least one of a coil and a transformer that have an input side winding wire and an output side winding wire, and at least one switching element for controlling current flowing in the input side winding and the output side winding wire, an switching operation of the switching element being controlled on the basis of an output voltage at a secondary side, a heat sink is provided to partition the inside of the case into a part mount chamber and an air flow path, the board is mounted in the part mount chamber, at least the switching element out of the circuit parts is mounted on the board while brought into contact with a surface at the part mount chamber side of the heat sink, and air is made to flow along the air flow path to cool the switching element through the heat sink.

In the switching power supply device, the heat sink is provided with through-holes that penetrates through the heat sink so that the part mount chamber and the air flow path intercommunicate with each other through the through-holes, and a part of air flowing through the air flow path flows through the through-holes into the part mount chamber to cool the circuit parts mounted on the board.

In the switching power device, the input side winding wire is provided at an air suction side of the air flow path and the output side winding wire is provided at an air blow-out side of the air flow path.

The switching power device further comprises a fan for making air flow through the air flow path, the fan being disposed in the part mount chamber of the case.

The switching power device further comprises a fan for making air flow through the air flow path, the fan being disposed in the air flow path.

According to the switching power supply device of the present invention, the heat sink is cooled by air flowing through the air flow path, and the heat of the switching element which is brought into contact with the surface at the part mount chamber side of the heat sink can be efficiently radiated. In addition, the inside of the case can be partitioned into the part mount chamber side and the air flow path by the heat sink, so that dust or the like can be prevented from intruding into the part mount chamber side of the case at which the board having the circuit parts mounted thereon is accommodated.

DETAILED DESCRIPTION OF THE PREFERRED EMBODIMENTS

Embodiments according to the present invention will be described hereunder with reference to the accompanying drawings.

Figure 1:
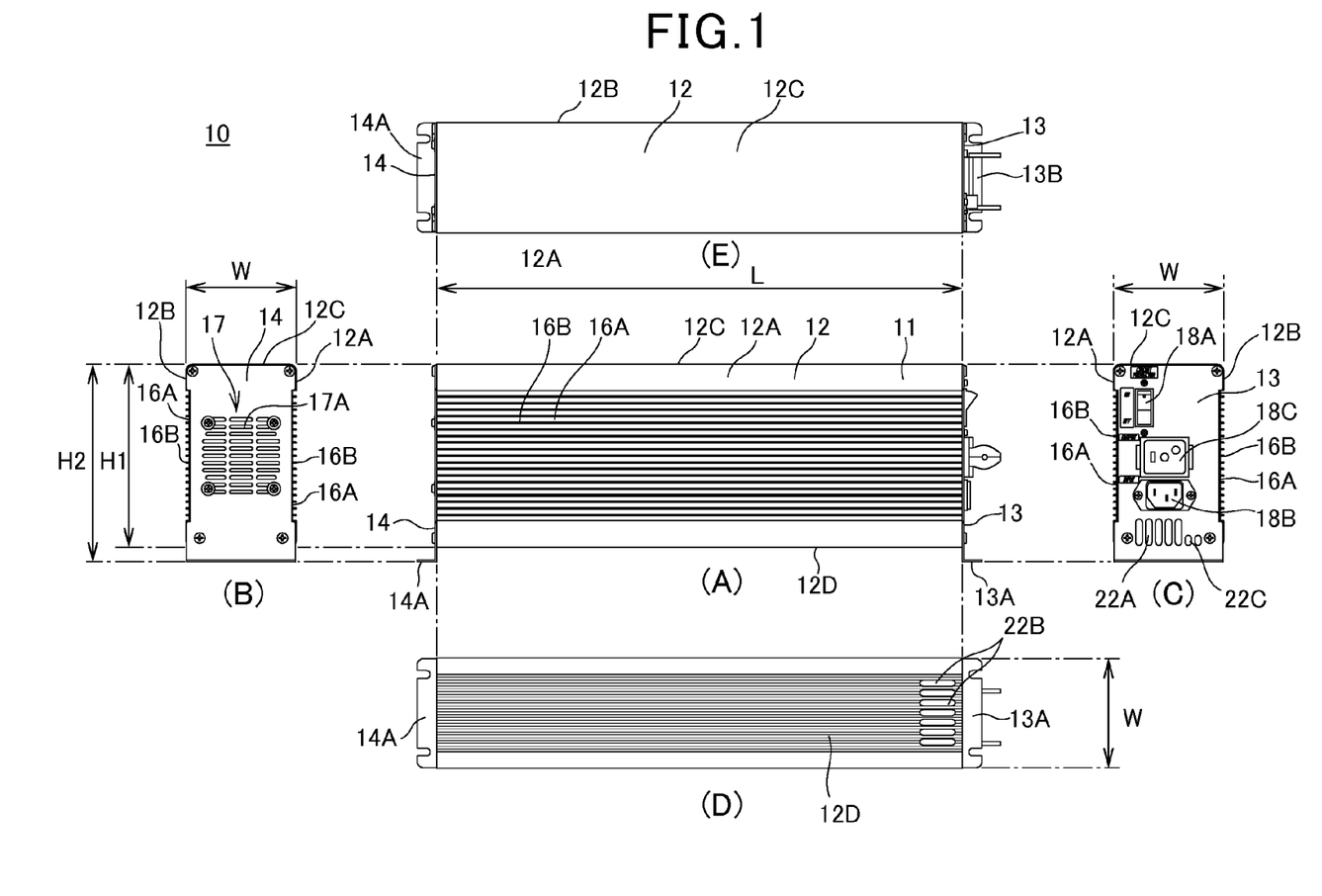
FIG. 1 shows the construction of a switching power supply device according to an embodiment of the present invention, wherein a middle stage (A) is a front view of the switching power supply device, a left stage (B) is a left side view of the switching power supply device, a right stage (C) is a right side view of the switching power supply device, a lower stage (D) is a bottom view of the switching power supply device and an upper stage (E) is a plan view of the switching power supply device.

FIG. 1 is a diagram showing the construction of a switching power supply device 10 according to an embodiment to which the present invention is applied. A middle stage (A) is a front view of the switching power supply device 10, a left stage (B) is a left side view of the switching power supply device 10, a right stage (C) is a right side view of the switching power supply device 10, a lower stage (D) is a bottom view of the switching power supply device 10 and an upper stage (E) is a top view of the switching power supply device 10.

The switching power supply device 10 has a power conversion unit comprising at least one of a coil and a transformer each of which has an input side winding wire 32A and an output side winding wire 32B, and at least one semiconductor element (switching element) 31 for controlling current flowing in the input side winding wire 32A and the output side winding wire 32B of at least one of the coil and the transformer (in the following embodiment, plural semiconductor elements 31 are provided). The switching power supply device 10 is a power conversion device for controlling the switching operation of the semiconductor element (s) 31 on the basis of an output voltage at a secondary side of the power conversion unit and subjecting input power to power conversion in the power conversion unit having the input side winding wire 32A and the output side winding wire 32B. For example, it is suitably used as an electrical discharge lamp lighting device.

As shown in FIG. 1, the switching power supply device 10 has a substantially barrel (for example, quadrangular prism type or the like) case (housing) 11. With respect to the case 11, a case body 12 and side surface plates 13 and 14 are formed of aluminum material. The case body 12 has a front face 12A, a back face 12B, a top face 12C and a bottom face 12D. That is, the case 11 is configured by the case body 12 so as to have a substantially barrel-like shape opened at the right and left sides thereof, and the side surface plates 13 and 14 are secured to the right and left sides of the body case 12 so as to block the opened right and left sides of the body case 12.

Plural recess portions 16A and plural projecting portions 16B are arranged vertically over the length L of the case body 12 on the front face 12A and the back face 12B of the case body 12. The recess portions 16A and the projecting portions 16B serve as heat radiation fins. The surface area of the case body 12 is increased by the recess portions 16A and the projecting portions 16B. Accordingly, the internal heat of the case 11 can be easily radiated to the outside of the case 11 through the case body 12.

The height dimension H2 of the side surface plates 13 and 14 is set to be larger than the height dimension H1 of the case body 12. The lower ends of the side surface plates 13 and 14 are bent in a substantially L-shape to form leg portions 13A and 14A. The leg portions 13A and 14A secured to the side surface plates 13 and 14 secured to the respective side surfaces of the case 11 are mounted on any mount face, thereby installing the switching power supply device 10. Accordingly, the switching power supply device 10 is set up while the bottom face 12D is floated from the mount face by the difference between the height dimension H2 of the side surface plates 13 and 14 and the height dimension H1 of the case body 12 (i.e., by the height corresponding to (H2−H1)).

As shown in (C) of FIG. 1, the side surface plate 13 forming one side surface of the case 11 is provided with a power supply switch 18A for turning on/off the switching power supply device 10, an input side connector 18B to which a power source is connected, and an output side connector 18C to which a wire for supplying target equipment with power converted by the switching power supply device 10 is connected. Furthermore, side surface side air suction ports 22A for introducing surrounding air into the case 11 are formed in the side surface plate 13. The side surface side air suction ports 22A are formed in an elongated elliptical shape, and the plural side surface side air suction ports 22A are provided at the lower portion of the side surface plate 13 so as to be arranged (for example, side by side) in the width W direction of the case 11.

As shown in (B) of FIG. 1, the side surface plate 14 forming the other side surface of the case 11 is provided with an air blow-out port 17 for blowing out air in the case 11 to the outside of the case 11 are formed substantially at the center of the side surface plate 14. An air blow-out fan 21 is secured to the side surface plate 14 so as to confront the air blow-out port 17. The air in the case 11 is discharged from the air blow-out port 17 provided to the air blow-out side surface plate 14 to the outside of the case 11 by driving the air blow-out fan 21. Furthermore, the air in the case 11 is blown out to the outside of the case 11, whereby the internal pressure of the case 11 become negative pressure. Accordingly, air is introduced from the surrounding of the case 11 into the case 11 through the side surface side air suction ports 22A formed in the air suction side surface plate 13 by the negative pressure.

The air blow-out port 17 comprises plural slender (elongated) hole type air blow-out holes 17A formed in the side surface plate 14. Each air blow-out port 17A is configured so as to have such a length (several mm) on the minor (short) axis that a finger or the like cannot be inserted through the air blow-out port 17A. According to this construction, a finger or the like can be prevented from coming into contact with the air blow-out fan 21 through the air blow-out ports 17 and thus being damaged.

As shown in (D) of FIG. 1, the bottom face 12D is provided with elongated elliptical bottom face side air suction ports 22B at an end portion thereof at the air suction side surface plate 13 side so that the air suction ports 22B are arranged (for example, side by side) in the width W direction of the case 11. As described above, the bottom face 12D is floated form the mount face by the height corresponding to the difference between the height dimension H2 of the side surface plates 13, 14 and the height dimension H1 of the case body 12 (H2−H1) under the state that the switching power supply device 10 is set up. Accordingly, air can be also sucked and introduced from the surrounding of the case 11 through the bottom face side air suction ports 22B into the case 11.

Figure 2A:
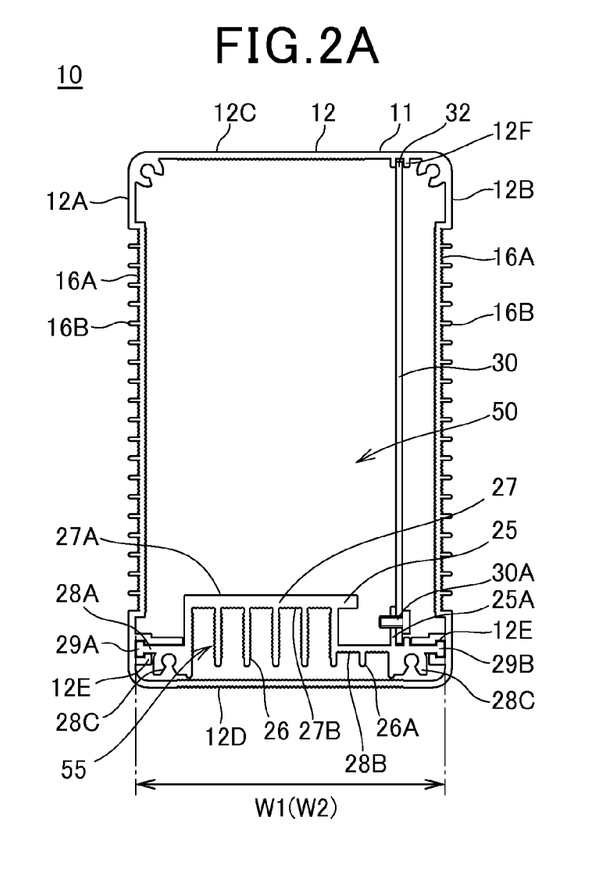
FIG. 2A is a cross-sectional view of an internal construction of the switching power supply device.

As shown in FIG. 2A, the switching power supply device 10 has a board 30 having circuit parts mounted thereon, and a heat sink 25 through which the inside of the case 11 is partitioned into a part mount chamber 50 and an air flow path 55. The board 30 is accommodated in the part mount chamber 50. The board 30 is disposed along the direction of the length L (see FIG. 1) substantially in parallel to the front face 12A and the back face 12B of the case 11. The board 30 is disposed to be nearer to the back face 12B side and spaced from the back face 12B by a predetermined insulating distance. The heat sink 25 is disposed along the direction of the length L (see FIG. 1) of the case 11 at the lower portion of the case 11 so as to be substantially perpendicular to the board 30. Plural boards as well as the board 30 may be mounted in the case 11, and the semiconductor elements 31 described later which are brought into contact with a surface of the heat sink 25 are mounted on the board 30 which is disposed substantially perpendicularly to the heat sink 25.

The heat sink 25 is formed of aluminum material which is high in thermal conductivity and light in weight. The heat sink 25 is configured so that the width dimension W2 thereof is substantially equal to the inner dimension W1 of the case 11. The heat sink 25 has a heat sink body 27 and arm portions 28A and 28B extending outwards in the width direction from the heat sink body 27. The arm portions 28A and 28B are formed over the length direction of the heat sink body 27. Fitting portions 29A and 29B are formed at the end portions of the arm portions 28A and 28B.

According to this construction, the case 11 and the heat sink 25 can be formed of light aluminum material, and thus the weight of the switching power supply device 10 can be reduced.

The case 11 has a pair of rail portions 12E which are formed on the inner walls of the front face 12A and back face 12B of the case body 12 integrally with the case body 12 over the length direction of the case 11. The rail portions 12E are configured to be substantially U-shaped in section from the front and back surfaces 12A and 12B to the inside of the case 11 and opened at both the side surface sides of the case body 12. The fitting portions 29A and 28B formed at the end portions of the arm portions 28A and 28B are fitted in the rail portions 12E, and slid from the side surface side of the case body 12 along the rail portions 12E, whereby the heat sink 25 can be secured to the case body 12. Fixing portions 28C for fixing the heat sink 25 to the side surface plates 13 and 14 by screws or the like are formed in the arm portions 28A and 28B.

Figure 2B:
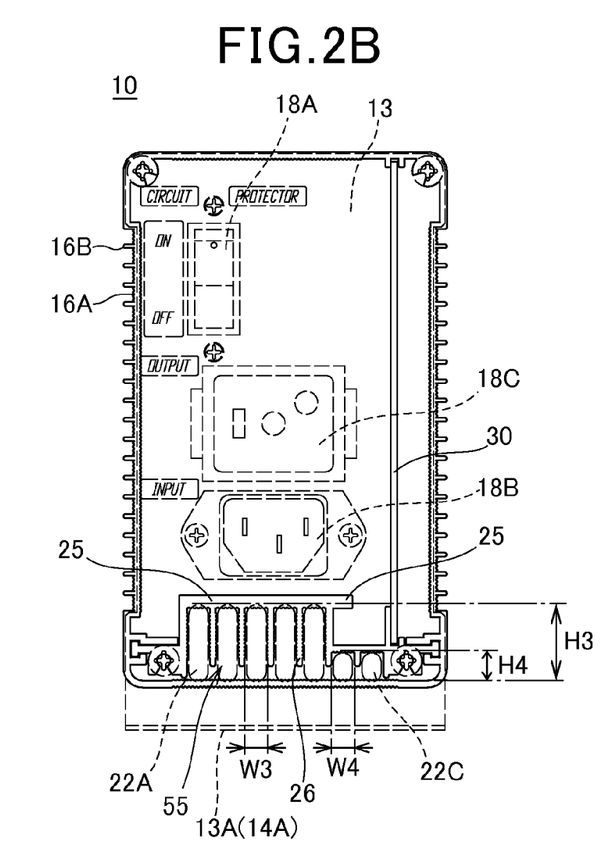
FIG. 2B is a perspective view of the internal construction of the switching power supply device when an air suction side surface plate is represented by a broken line.

The air flow path 55 which is a space insulated from the part mount chamber 50 of the case 11 by the heat sink 25 is formed between the heat sink 25 and the bottom face 12D. The heat sink 25 has plural fins 26 on the back surface 27B thereof which confronts the air flow path 55 side of the heat sink body 27. The fins 26 are provided over the length direction of the heat sink body 27, and the back surface 27B of the heat sink body 27 is increased in surface area by these fins 26. FIG. 2B is a perspective view of the switching power supply device 10, and the air suction side surface plate 13 is represented by a broken line. As shown in FIG. 2B, the height dimension H3 of the side surface side air suction ports 22A formed in the air suction side surface plate 13 is set to be substantially equal to the interval between the back surface 27B of the heat sink body 27 and the bottom face 12D. Furthermore, the width dimension W3 of the side surface side air suction ports 22A is set to be substantially equal to the interval between the adjacent fins 26. According to this construction, air introduced from the side surface side air suction ports 22A into the case 11 can be made to flow through the air flow path along the back face 27B while the fins 26 do not disturb the air flow (i.e., do not serve as air flow resistors). Therefore, the heat sink 25 can be cooled efficiently. Furthermore, the air introduced from the side surface side air suction ports 22A into the case 11 can be prevented from being directly guided from the side surface side air suction ports 22A to the part mount chamber 50 without passing through the air flow path 55.

As not shown, each of the bottom face side air suction ports 22B formed in the bottom face 12D which is disposed to be floated from the mount face of the switching power supply device 10 is disposed between the adjacent fins 26 as in the case of the side surface side air suction ports 22A, and the width dimension thereof is set to be substantially equal to the interval (pitch) between the adjacent fins 26.

Heat sink side board fixing portions 25A through which the lower portion 30A of the board 30 is fixed to the heat sink 25 by screws or the like are provided to the arm portion 28B extending to the back face 12B side of the case 11. A board rail 12F is formed on the top surface 12C of the case body 12 so as to face the part mount chamber 50 of the case 11. The board 30 is fixedly mounted in the case 11 so that the upper end portion 32 of the board 30 is fitted in the board rail 12F and the lower portion 30a of the board 30 is fixed to the heat sink side board fixing portion 25A by screws or the like.

The heat sink 25 may be configured so that a small fin(s) 26A is formed at the air flow path 55 side of the arm portion 28B. The arm portion 28B is formed to be larger than the arm portion 28A because the board 30 is fixed to the arm portion 28B. The surface area of the arm portion 28B at the air flow path 55 side is larger because of the small fin 26A, and thus the cooling efficiency of the heat sink 25 can be increased by effectively using the air stream flowing through the air flow path 55 between the arm portion 28B and the bottom face 12D.

A small air suction port (s) 22C corresponding to the small fin(s) 26A is formed in the air suction side surface plate 13. The small air suction port 22C is configured so that the height dimension H4 thereof is set to be substantially equal to the interval distance between the surface of the arm portion 28B at the air flow path 55 side and the bottom face 12D. The small air suction port 22C is disposed between the adjacent small fins 26A, and the width dimension W4 of the small air suction port 22C is set to be substantially equal to the interval distance between the adjacent small fins 26A.

As not shown, the bottom face side air suction port(s) 22 is provided between the small fins 26A in the bottom face 12D as in the case of the adjacent fins 26.

Before the heat sink 25 and the board 30 are mounted in the case 11, the heat sink side board fixing portion 25A of the heat sink 25 and the lower portion 30A of the board 30 are fixed to each other by screws or the like at the outside of the case 11, whereby they are joined to each other in a substantially L-shape. The heat sink 25 and the board 30 which are joined to each other in a substantially L-shape in section at the outside of the case 11 in advance are inserted from the side surface opening portion of the case body 12 into the case 11 while the heat sink 25 is slid along the rail portions 12E and the upper end portion 32 of the board 30 is slid along the board rail 12F, and secured in the case 11.

Figure 3:
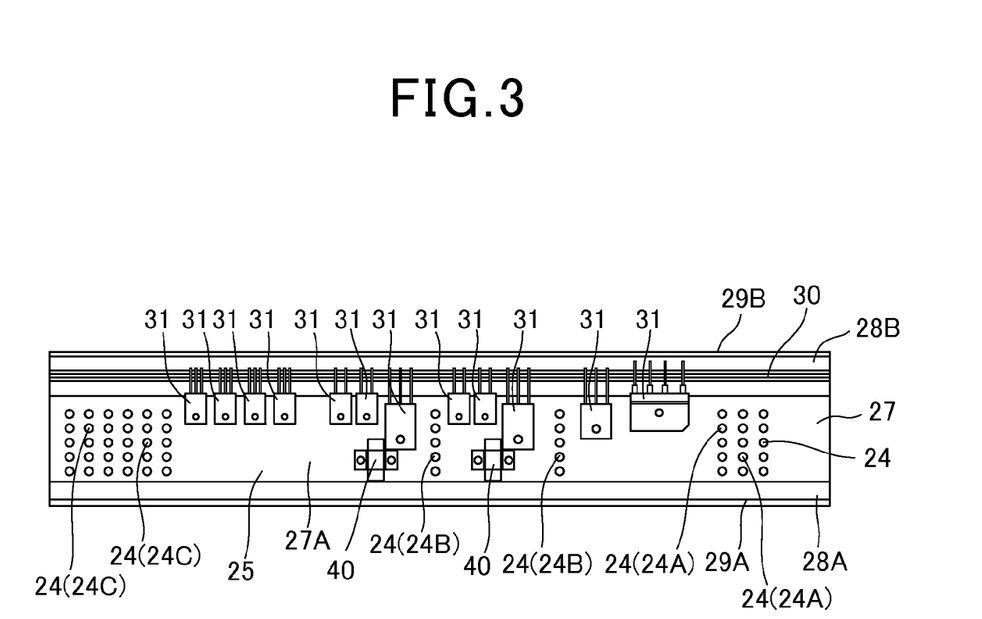
FIG. 3 is a plan view of a heat sink.

FIG. 3 is a plan view showing the heat sink 25 to which the board 30 is joined. In FIG. 3, only the semiconductor elements 31 are mounted on the board 30 for simplification of the description, but various kinds of circuit parts such as an input side winding wire 32A, an output side winding wire 32B, current detecting resistors 33 and 33A, electrolytic capacitors 34, film capacitors 35, a control circuit 36 for controlling the semiconductor elements 31, etc. are mounted on the board 30 (see FIG. 4) as described later.

As shown in FIG. 3, the plural semiconductor elements 31 are mounted on the board 30. These semiconductor elements 31 contain semiconductor switching elements which repeat ON/OFF operation and have a large amount of heat generation. At least the semiconductor elements 31 out of the circuit parts mounted on the board 30 are mounted on the board 30 while brought into contact with the surface 27A at the part mount chamber 50 side of the heat sink body 27, and thermally connected to the heat sink 25. According to this construction, the heat generated by the semiconductor elements 31 is transmitted to the heat sink 25, and radiated through the heat sink 25, thereby suppressing temperature increase of the semiconductor elements 31.

Furthermore, thermal protectors 40 are secured to the surface 27A of the heat sink 25, and the temperature of the surface 27A of the heat sink 25 is detected by the thermal protectors 40. The thermal protectors 40 are used for safety control, and the switching power supply device is forcedly turned off when the temperature of the surface 27A detected by the thermal protectors 40 exceeds a preset temperature range. Accordingly, the switching power supply device 10 can be prevented from falling into an overheat state due to some trouble such as failure of the air blow-out fan 21 or the like, so that the safety of the switching power supply device 10 can be enhanced.

Plural through-holes 24 are formed in the heat sink body 27 of the heat sink 25 so that the part mount chamber 50 and the air flow path 55 are made to intercommunicate with each other through the through-holes 24. These through-holes 24 are arranged in a line in the width direction of the heat sink body 27, and plural lines of the through-holes 27 are arranged in the longitudinal direction of the heat sink body 27 so as to be spaced from one another at predetermined intervals. The respective through-holes 24 arranged in a line in the width direction of the heat sink body 27 are arranged between the adjacent fins 26 provided to the back surface 27B. The through-holes 24 contain air suction side through-holes 24A arranged at the air suction side, center side through-holes 24B arranged substantially at the center peripheral portion of the case 11 and blow-out side through-holes 24C arranged at the air blow-out side when the heat sink 25 is secured to the case 11.

The air suction side through-holes 24A are formed in the heat sink 25 so as to be displaced inwardly from the bottom face side air suction ports 22B in the case 11 with respect to the vertical direction of the bottom face side air suction ports 22B provided to the bottom face 12D. The center side through-holes 24B are formed in a line in the width direction of the heat sink body 27 at the substantially center position of the case 11 and also at the substantially middle position between the substantially center position of the case 11 and the air suction side through-holes 24A. The plural arrays of air blow-out side through-holes 24C are provided at the air blow-out side of the heat sink body 27. In this case, the total aperture ratio (i.e., the ratio in number of holes) between the air suction side through-holes 24A and the air blow-out side through-holes 24C is preferably set so that the aperture ratio of the air blow-out side through-holes 24C is larger than that of the air suction side through-holes 24A. For example, the total aperture ratio (the ratio in number of holes) of the air suction side through-holes 24A, the center side through-holes 24B and the air blow-out side through-holes 24C may be set to substantially 3:2:6, for example.

Figure 4:
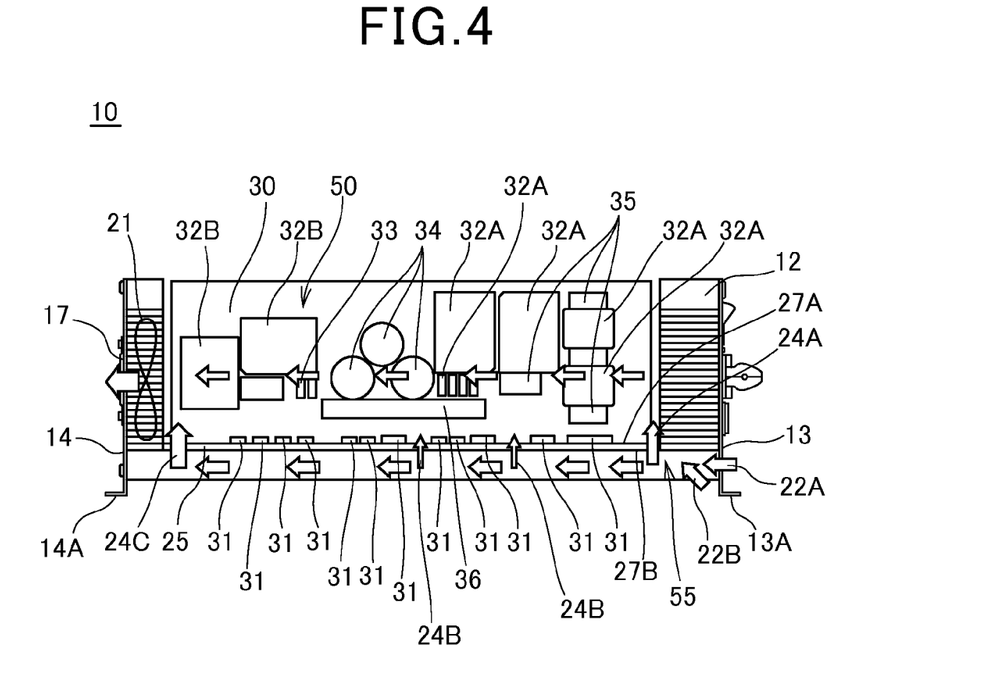
FIG. 4 is a cross-sectional view showing air flow in a case (housing)

Arrows represented in FIG. 4 represent flow of air introduced into the case 11, that is, an air stream in the case 11. As shown in FIG. 4, air sucked from the side surface side air suction ports 22A and the bottom face side air suction ports 22B into the case 11 flows along the back surface 27B of the heat sink 25 to the air blow-out side surface plate 14 in the air flow path 55.

The internal pressure in the case 11 is set to negative pressure by driving the air blow-out fan 21, and air is introduced from the side surface side air suction ports 22A and the bottom face side air suction ports 22B into the case 11.

The air blow-out fan 21 is disposed in the part mount chamber 50 of the case 11, and air introduced into the case 11 is passed from the air flow path 55 through the through-holes 24 formed in the heat sink 25 to the part mount chamber 50.

As described above, the through-holes 24 are constructed by the air suction side through-holes 24A, the center side through-holes 24B and the air blow-out side through-holes 24C. The number of air blow-out side through-holes 24C is set to be larger than the number of the air suction side through-holes 24A or the number of the center side through-holes 24B. Therefore, the resistance to air flow of the air blow-out side through-holes 24C is lower than that of the air suction side through-holes 24A or the center side through-holes 24B. Accordingly, most of the air introduced into the air flow path 55 flows along the back surface 27B of the heat sink 25 to the air blow-out side through-holes 24C having lower resistance to air flow while a part of the air introduced into the air flow path 55 is sucked through the air suction side through-holes 24A and the center side through-holes 24B to the part mount chamber 50.

As described above, air is introduced from the side surface side air suction ports 22A and the bottom face side air suction ports 22B into the case 11, and the air stream in the air flow path 55 can be made to flow along the back surface 27B of the heat sink 25. Accordingly, the heat sink 25 is cooled by air-cooling, whereby the heat generated from the semiconductor elements 31 mounted on the board 30 can be efficiently radiated under the state that the semiconductor elements 31 are brought into contact with the surface 27A of the heat sink 25, thereby cooling the semiconductor elements 31.

The heat generated by the semiconductor elements 31 is absorbed through the heat sink 25 by air, and the air which is heated to high temperature and flows through the air flow path 55 is led to the part mount chamber 50 through the air blow-out side through-holes 24C, and then discharged from the air blow-out ports 17 to the outside of the case 11. Accordingly, the high-temperature air which absorbs the heat generated by the semiconductor elements 31 can be discharged to the outside of the case 11 without affecting the circuit parts mounted on the board 30. Furthermore, the heat sink 25 serving to radiate the heat generated by the semiconductor elements 31 is mounted in the case 11 without being directly (barely) exposed to the outside of the case 11. Therefore, a hand or the like can be prevented from directly touching the high-temperature heat sink 25, and the switching power supply device 10 can be used safely for domestic use.

A part of the air introduced into the air flow path 55 is sucked through the air suction side through-holes 24A and the center side through-holes 24B into the part mount chamber 50. The input side winding wire 32A is provided at the air suction side of the air flow path 55 on the board 30. The input side winding wire 32A comprises two kinds of coils such as a common mode coil and a choke coil for boost chopper. Furthermore, the output side winding wire 32B is provided at the air blow-out side of the air flow path 55 on the board 30. The output side winding wire 32B comprises two kinds of coils such as a choke coil for step-down chopper and a choke coil for generating high voltage pulse.

The air sucked from the air suction side of the air flow path 55 through the air suction side through-holes 24A into the part mount chamber 50 cools the input side winding wire 32A provided to the board 30 by air-cooling. Furthermore, the air sucked from the air flow path 55 through the center side through-holes 24B into the part mount chamber 50 cools the control circuit, etc. provided to the board 30 by air-cooling.

According to this construction, the input side winding wire 32A provided to the board 30, that is, the circuit parts at the primary side of the power source are cooled by the low-temperature air sucked into the part mount chamber 50 from the air suction side through-holes 24A of the heat sink 25 provided at the air suction side of the air flow path 55. Accordingly, the input side winding wire 32A can be cooled by low-temperature air before the air absorbs the heat generated by the semiconductor elements 31, so that the circuit parts at the primary side of the power source can be efficiently cooled with a small amount of air flow.

Furthermore, air can be introduced from the air flow path 55 into the part amount chamber 50 through the center side through-holes 24B formed at the center side of the heat sink 25. Accordingly, the amount of air flowing through the part mount chamber 50 can be increased more greatly as the air flow approaches to the air blow-out side of the air flow path 55. Accordingly, the amount of air flowing to the air blow-out side winding wire 32B (the circuit parts at the secondary side of the power source) provided at the air blow-out side of the air flow path 55 can be increased, and even when the air absorbs the heat generated by the circuit parts at the primary side of the power source and thus the temperature of the air increases, the circuit parts at the secondary side of the power source can be sufficiently cooled.

The air introduced from the air flow path 55 to the part mount chamber 50 through the through-holes 24 which are formed in the heat sink 25 and through which the part mount chamber 50 and the air flow path 55 intercommunicate with each other deflects the air flow direction thereof by substantially 90° (substantially right angle) from the air flow direction of the air flowing in the air flow path 55, and then is sucked into the part amount chamber 50 substantially vertically. Even when the air introduced into the case 11 through the bottom face side air suction ports 22B is sucked from the air suction side through-holes 24A into the part mount chamber 50, the air suction side through-holes 24A are formed to be displaced from the bottom face side air suction ports 22B in the horizontal direction with respect to the vertical direction of the bottom, so that the air introduced into the case 11 through the bottom face side air suction ports 22B deflects the flowing direction thereof to the horizontal direction in the air flow path 55, and then is sucked from the air suction side through-holes 24A to the part mount chamber 50.

There is such a case that not only air but also dust intrudes from the surroundings into the case 11 through the side surface side air suction ports 22A and the bottom face side air suction ports 22B. When dust intruding into the case 11 adheres to or deposits onto the circuit parts mounted on the board 30, it may cause problems that the circuit parts are overheated, the electrical circuit is short-circuited, etc. However, according to the construction of this embodiment, the flow of air introduced into the part mount chamber 50 through the through-holes 24 which are formed in the heat sink 25 so as to penetrate through the heat sink 25 and through which the part mount chamber 50 and the air flow path 55 intercommunicate with each other) is rapidly and substantially vertically changed in flow direction from the air flow in the air flow path 55. Therefore, this rapid change of the air flowing direction can prevent the dust from intruding into the part mount chamber 50 through the through-holes 24 together with the air. The dust intruding into the case 11 is accumulated in the air flow path 55 in which no circuit part is provided. Therefore, no dust intrudes into the part mount chamber 50 containing the board 30 having the circuit parts mounted thereof, so that no dust is accumulated in the part mount chamber 50. Therefore, the failure occurrence probability of the switching power supply device 10 due to the effect of dust (external factor) can be reduced.

<Another Embodiment>

In the above embodiment, the air blow-out fan 21 is disposed in the part mount chamber 50 of the case 11. However, in this embodiment, an air blow-out fan 121 (represented by a dotted line in FIG. 5) is secured to a bottom face 112D of a case 111 and disposed at the air flow path 55 side.

Figure 5:
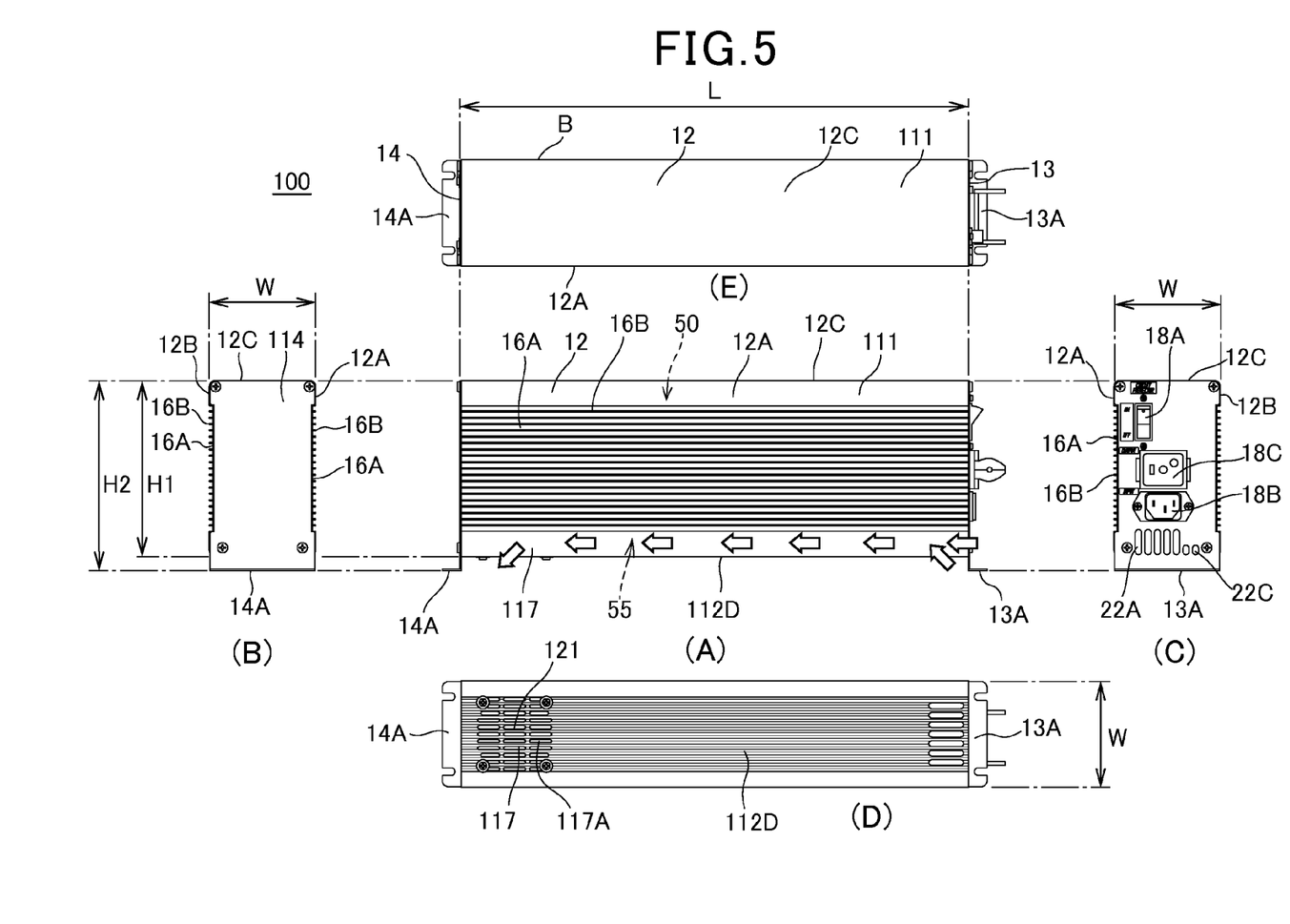
FIG. 5 shows the construction of a switching power supply device according to another embodiment of the present invention, wherein a middle stage (A) is a front view of the switching power supply device, a left stage (B) is a left side view of the switching power supply device, a right stage (C) is a right side view of the switching power supply device, a lower stage (D) is a bottom view of the switching power supply device and an upper stage (E) is a plan view of the switching power supply device.

FIG. 5 is a diagram showing the construction of a switching power source 100 of this embodiment, and schematically shows the flow of air in the case 11. In FIG. 5, the same parts as the switching power supply device shown in FIG. 1 are represented by the same reference numerals, and the description thereof is omitted. Furthermore, as not shown, this modification may be configured so that the through-holes 24 penetrating from the back surface to the front surface of the heat sink 25 shown in FIG. 3 are not provided to the heat sink 25 shown in FIG. 3. The other internal structure of the switching power supply device has the same as the switching power supply device 10 shown in FIGS. 2, 3 and 4, and the description thereof is omitted.

In this embodiment, an air blow-out port 117 is formed in a bottom face 112D forming the bottom surface of the case 11. The air blow-out port 117 is formed at the other side 112F opposite to one end side 112E at which the air suction ports 22B are formed. The air blow-out fan 121 is provided in the air flow path 55 so as to confront the air blow-out ports 117. By driving the air blow-out fan 121, an air stream in which air sucked from the surroundings through the air suction ports 22A and 22B flows to the air blow-out port 117 as shown in a middle stage (A) of FIG. 5 is formed in the air flow path 55. The air flowing in the air flow path 55 flows along the back surface 27B (see FIG. 2) of the heat sink 25 mounted in the case 11, and cools the semiconductor elements 31 joined to the surface 27A of the heat sink 25. Furthermore, the air blow-out port 117 comprises plural elongated (slender) holes type air blow-out holes 117A formed in the bottom face 112D. Each air blow-out hole 117A is configured so that the minor (short) axis length thereof is set to such a size (several mm) that a finger or the like cannot intrude into the hole. According to this construction, a finger or the like can be prevented from coming into contact with the air blow-out fan 121 through the air blow-out port 117 and damaged.

For example, when it is unnecessary to introduce air into the part mount chamber 50 of the case 11 because circuit parts other than circuit parts joined to the heat sink 25 out of the circuit parts mounted on the board 30 are constructed by heat resistance parts or the like, the air blow-out fan 121 may be disposed at the air flow path 55 side so as to confront the air blow-out port 117 formed in the bottom face 112D as shown in FIG. 5. According to this construction, the semiconductor elements 31 joined to the surface 27A of the heat sink 25 can be cooled by air flowing along the back surface 27B of the heat sink 25 in the air flow path 55, and also dust can be prevented from intruding, together with air, into the part mount chamber 50 of the case 11 in which the board 30 is mounted.

For example, the air blow-out port 117 may be provided to the side surface plate 14 so as to confront the air flow path 55. However, in this case, in order to suppress the height of the air flow path 55 to a predetermined height, it is necessary to provide plural air blow-out fans having small capacities so that the air blow-out fans are arranged side by side in the width direction, and the number of parts increased. In this embodiment, the air blow-out port 117 is provided to the bottom face 112D which is disposed to be floated from the mount face of the switching power supply device 100. Therefore, the air blow-out fan 121 which can obtain a sufficient capacity by only one air blow-out fan can be disposed so as to confront the air blow-out port 117 without increasing the height of the air flow path 55.

The present invention is not limited to the above embodiments, and various modifications may be made without departing from the subject matter of the present invention. In this embodiment, the air blow-out ports 21, 121 are provided so as to confront the air blow-out ports 17, 117 to suck air into the air flow path 55, thereby making the air flow through the air flow path 55. However, the present invention is not limited to this style, and a fan may be provided at an air blow-in port to push air into the air flow path 55. Alternatively, fans may be provided at both the air flow-in port and the air blow-out port.

What is claimed is:

1. A switching power supply device that has at least one switching element and performs power conversion on the basis of a switching operation of the switching element, comprising:
a case;
a board that has circuit parts containing at least one switching element mounted thereon and is accommodated in the case; and
a heat sink that is provided in the case so as to partition the inside of the case into a part mount chamber having the board accommodated therein and an air flow path through which air flows,
wherein the at least one switching element out of the circuit parts is mounted on the board while brought into contact with a surface of the heat sink that faces the part mount chamber, and cooled through the heat sink by the air flowing in the air flow path, and
wherein the heat sink is provided with through-holes that penetrates through the heat sink so that the part mount chamber and the air flow path intercommunicate with each other through the through-holes, and a part of air flowing in the air flowing path is introduced from the air flow path through the through-holes to the part mount chamber to cool the circuit parts mounted on the board.

2. The switching power supply device according to claim 1, wherein the air flow path has an air suction port through which air is introduced from the outside of the case and an air blow-out port through which air is blown out to the outside of the case, and the air introduced from the air suction port is made to flow through the air flow path along another surface of the heat sink that faces the air flow path.

3. The switching power supply device according to claim 1, wherein the part of the air flowing in the air flow path is introduced to the part mount chamber while an air flowing direction thereof is deflected by a substantially right angle.

4. The switching power supply device according to claim 2, wherein the circuit parts contains a power conversion unit having an input side winding wire and an output side winding wire, and the input side winding wire is provided at an air suction side of the air flow path while the output side winding wire is provided at an air blow-out side of the air flow path.

5. The switching power supply device according to claim 4, wherein the power conversion unit comprises at least one of a coil and a transformer.

6. The switching power supply device according to claim 1, further comprising an air blower for making air flow through the air flow path.

7. The switching power supply device according to claim 6, wherein the air blower is disposed in the part mount chamber.

8. The switching power supply device according to claim 6, wherein the air blower is disposed in the air flow path.

9. A switching power supply device having a case, a board that has circuit parts mounted thereon and is accommodated in the case, the circuit parts containing at least one of a coil and a transformer that have an input side winding wire and an output side winding wire, and at least one switching element for controlling current flowing in the input side winding and the output side winding wire, an switching operation of the switching element being controlled on the basis of an output voltage at a secondary side,
wherein a heat sink is provided to partition the inside of the case into a part mount chamber and an air flow path, the board is mounted in the part mount chamber, at least the switching element out of the circuit parts is mounted on the board while brought into contact with a surface at the part mount chamber side of the heat sink, and air is made to flow along the air flow path to cool the switching element through the heat sink, and
wherein the heat sink is provided with through-holes that penetrates through the heat sink so that the part mount chamber and the air flow path intercommunicate with each other through the through-holes, and a part of air flowing through the air flow path flows through the through-holes into the part mount chamber to cool the circuit parts mounted on the board.

10. The switching power device according to claim 9, wherein the input side winding wire is provided at an air suction side of the air flow path and the output side winding wire is provided at an air blow-out side of the air flow path.

11. The switching power device according to claim 9, further comprising a fan for making air flow through the air flow path, the fan being disposed in the part mount chamber of the case.

12. The switching power device according to claim 9, further comprises a fan for making air flow through the air flow path, the fan being disposed in the air flow path.

* * * * *